(12) United States Patent
Ice

(10) Patent No.: US 7,563,035 B2
(45) Date of Patent: Jul. 21, 2009

(54) CONNECTOR FOR BOX OPTICAL SUBASSEMBLY

(75) Inventor: Donald A. Ice, Milpitas, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 11/381,115

(22) Filed: May 1, 2006

(65) Prior Publication Data
US 2006/0251361 A1    Nov. 9, 2006

Related U.S. Application Data

(60) Provisional application No. 60/676,425, filed on Apr. 29, 2005.

(51) Int. Cl.
*G02B 6/36* (2006.01)
*G02B 6/12* (2006.01)
(52) U.S. Cl. .................................... 385/92; 385/14
(58) Field of Classification Search ............. 385/92–94, 385/14
See application file for complete search history.

(56) References Cited

U.S. PATENT DOCUMENTS

| | | | |
|---|---|---|---|
| 5,005,939 A * | 4/1991 | Arvanitakis et al. ........... 385/53 |
| 6,607,307 B2 | 8/2003 | Gilliland et al. |
| 6,633,420 B2 | 10/2003 | Huang |
| 6,661,565 B2 * | 12/2003 | Shaw et al. ................... 359/297 |
| 6,665,498 B1 | 12/2003 | Jiang et al. |
| 6,769,818 B2 | 8/2004 | Wu |
| 6,901,221 B1 * | 5/2005 | Jiang et al. ................... 398/138 |
| 6,952,532 B2 * | 10/2005 | Dair et al. .................... 398/139 |
| 6,954,592 B2 | 10/2005 | Tan et al. |
| 7,144,259 B2 * | 12/2006 | Ice et al. ........................ 439/79 |
| 2004/0071413 A1 | 4/2004 | Tsumori |
| 2004/0077207 A1 * | 4/2004 | Ice .............................. 439/357 |
| 2004/0208601 A1 | 10/2004 | Tan et al. |
| 2005/0105915 A1 * | 5/2005 | Light .......................... 398/164 |
| 2005/0117854 A1 * | 6/2005 | Chiu et al. ..................... 385/92 |
| 2006/0110164 A1 * | 5/2006 | Cook et al. .................. 398/135 |

OTHER PUBLICATIONS

Office Action mailed Feb. 5, 2008, U.S. Appl. No. 10/993,251.
Office Action mailed Jun. 26, 2007, U.S. Appl. No. 10/993,251.

* cited by examiner

*Primary Examiner*—Charlie Peng
(74) *Attorney, Agent, or Firm*—Workman Nydegger

(57) ABSTRACT

Discloses is a transceiver module having a box optical subassembly, a printed circuit board, and a connector extending from the box optical subassembly to the printed circuit board. The box optical subassembly includes a laser diode, a laser driver, and at least one pin receiving a driver signal for said laser driver. Optionally, the box optical subassembly includes a thermal electric cooler to cool one or more components within the box optical subassembly. The connector mounts to the at least one pin and is receivable by a pin header mounted to the printed circuit board to accommodate for variations in the orientation of the optical subassembly relative to the printed circuit board during optical alignment of the optical subassembly.

13 Claims, 4 Drawing Sheets

CONNECTOR FOR BOX OPTICAL SUBASSEMBLY

CROSS-REFERENCE TO RELATED APPLICATIONS

This application claims the benefit of the U.S. Provisional Patent Application No. 60/676,425 filed Apr. 29, 2005, and entitled "Connector for Box Optical Subassembly," which is incorporated herein by reference in its entirety.

BACKGROUND OF THE INVENTION

1. The Field of the Invention

The present invention relates generally to optical transceiver modules. More specifically, the present invention relates to using a connector to electrically connect a box optical sub-assembly to an optical transceiver module's printed circuit board.

2. The Relevant Technology

The basic optical components of conventional transceivers include two optical sub-assemblies (OSAs); a transmitter optical sub-assembly (TOSA) and a receiver optical sub-assembly (ROSA). The TOSA receives electrical signals from a host device via circuitry of the transceiver module and generates a corresponding optical signal that is then transmitted to a remote node in an optical network. Conversely, the ROSA receives an incoming optical signal and outputs an electrical signal that can be processed by the host device. Additionally, most transceivers include a rigid printed circuit board (PCB) containing, among other things, control circuitry for the TOSA and ROSA.

There are various TOSAs that can be used within the transceiver module. Some TOSAs electrically connect with a laser driver mounted on the PCB. This laser driver delivers a modulated current to the TOSA to generate the optical signals to be sent through the optical network. Other TOSAs can include a ceramic or thin metal box that contains the laser driver and the other optical components associated with a TOSA. These later TOSAs are typically referred to as box TOSAs.

The connections between the optical sub-assemblies and the PCB in the transceiver module have various electrical and mechanical requirements. One of the most common electrical connection components used in conventional optical transceiver modules is a flexible printed circuit board, or "flex circuit," that connects the PCB to leads associated with the optical subassembly, such as a box TOSA. Flex circuits have several advantages, including good electrical performance and radio frequency response. Advantageously, the flex circuits also have the ability to take up tolerances in the modules and to withstand stresses that arise during manufacture and operation of the modules.

While flex circuits have been widely used in recent years in optical transceiver modules, flex circuits represent a significant portion of the costs and labor required to manufacture transceiver modules. As the price of transceiver modules drops, the costs associated with flex circuits continue to represent an increasing proportion of the overall costs of transceiver modules. Due to the nature of flex circuits, the costs of producing flex circuits are generally higher than the cost of a PCB that performs the same functions.

Additionally, flex circuits by design do not provide secure mechanical attachment between the OSA and the PCB. This can adversely affect the operation of the transceiver module since any shock vibration or side loads can cause movement of the OSA, resulting in changes in the orientation of the OSA's optical axis relative to the transceiver module housing and the flex circuit and movement of the PCB relative to the OSA, thus misaligning the OSA and potentially varying the optical output power of the OSA.

Further, the use of flex circuits with box TOSAs can be problematic because the pins used to connect the box TOSA to the PCB can exit the box generally perpendicular to the longitudinal axis of the transceiver module. This results in the flex circuit being twisted or turned to make the necessary electrical connection with the PCB, which may require additional space and reduce manufacturability.

BRIEF SUMMARY OF THE INVENTION

These and other limitations are overcome by the present invention, which relates to a device usable to align an optical subassembly and a printed circuit board. In one configuration, an assembly using the device of the present invention includes a box optical subassembly that has a laser diode, a laser driver, and at least one pin that selectively receives a driver signal for the laser driver. A connector extends from the at least one pin to a printed circuit board. This connector has rigidity greater than a flexible circuit to aid with manufacturability of assembly and also a transceiver module within which the assembly may be disposed.

In another configuration, a transceiver module can include an optical subassembly having a laser diode, a laser driver, and at least one pin receiving a driver signal for the laser driver. Extending from the at least one pin to a printed circuit board is a rigid connector. This rigid connector can include a plurality of pad contacts that are selectively connectable with a pin header mounted on the printed circuit board. The rigid connector can mount between two rows of pins of the pin header so that the plurality of pad contacts on one or more surfaces of the connector electrically contact one or more of the pins of the pin header. Similarly, a plurality of through-hole contacts can electrically contact the at least one pin extending from the optical subassembly.

In another configuration, a transceiver module can include a top portion mountable to a base portion. The base portion can include a cavity defined by at least one wall and a base. Mountable within the cavity is an optical subassembly mountable having a laser diode, a laser driver, and a plurality of optical subassembly pins, at least one of the plurality of pins selectively receiving a driver signal for the laser driver. A printed circuit board can also mount within the cavity. Extending between the plurality of optical subassembly pins and the printed circuit board is a rigid connector that mounts within the cavity between a portion of the optical subassembly and the at least one wall. With the plurality of pad contacts selectively mounting to the plurality of pins and the plurality of through-hole contacts selectively receiving the plurality of optical subassembly pins the rigid connector aids in aligning the optical subassembly to the printed circuit board in at least one of an x-direction, a y-direction and a z-direction.

As a result of embodiments of the present invention, variability in optical subassembly dimensions caused by internal optical alignment are accounted for while also preserving the benefits of a rigid mechanical attachment of the subassembly to a printed circuit board in an optical transceiver module.

These and other objects and features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF THE PREFERRED EMBODIMENTS

The present invention generally relates to a connector that can electrically connect a box optical subassembly with a printed circuit board in a robust manner to prevent damage to the optical subassembly and the printed circuit board by forces applied to the housing of the transceiver module. Additionally, the present invention relates to a connector that aids with aligning of the optical subassembly relative to the connector and also the connector and optical subassembly relative to the printed circuit board by accommodating variations in x, y, and z positions of the optical subassembly and the printed circuit board. By so doing, the connector of the present invention limits the potential for misalignment of the optical assembly within the transceiver module both during manufacture of the transceiver module and during use of the transceiver module. Further, the present invention relates to a connector that reduces the difficulty of manufacturing a transceiver module by eliminating the difficulties associated with flexible or flex circuits.

Figure 1:
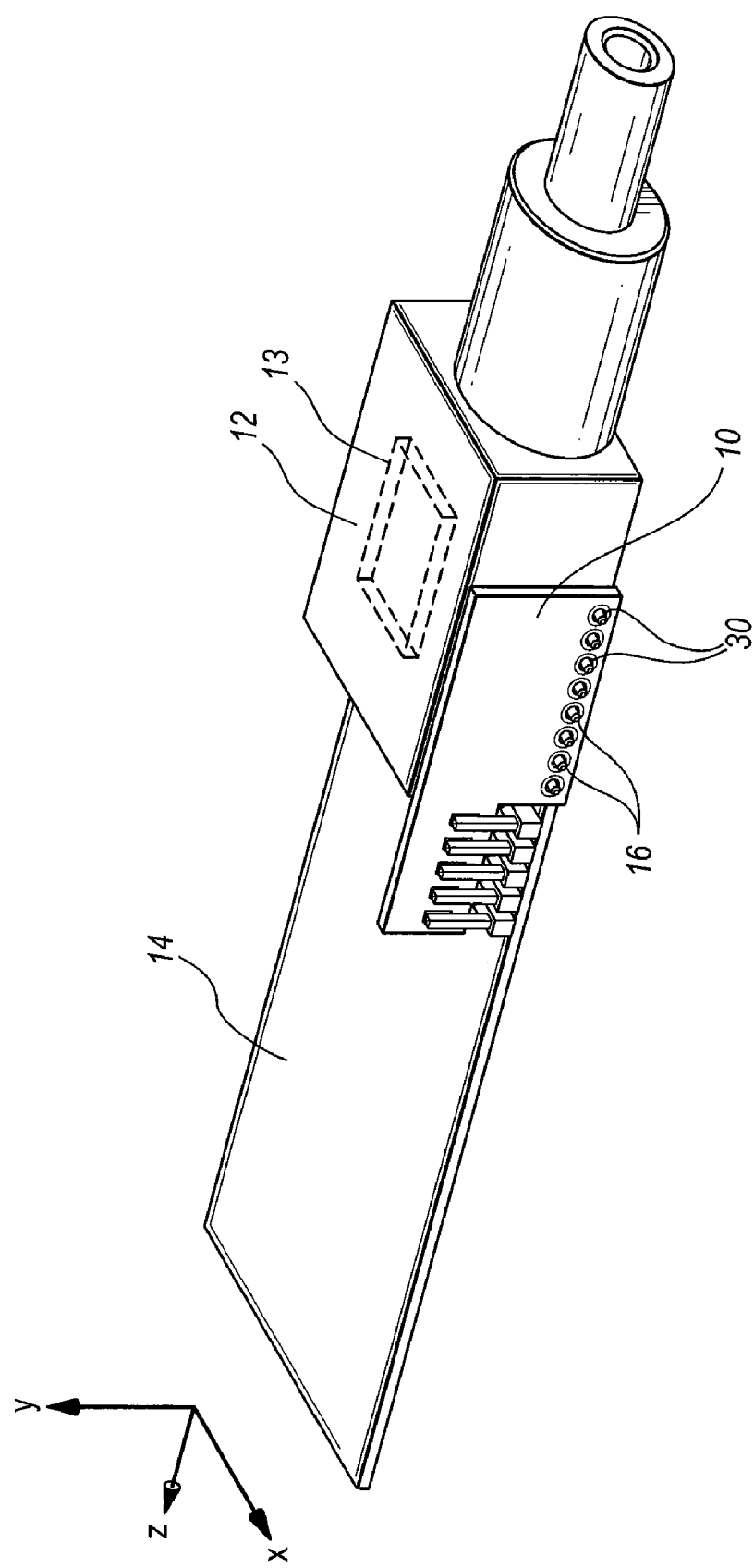
FIG. 1 illustrates a perspective view of a connector of the present invention extending between a box TOSA and a printed circuit board usable with a transceiver module.

Turning to FIG. 1, illustrated is one embodiment of a connector of the present invention, identified by reference numeral 10. As shown, connector 10 mounts to a box optical subassembly 12 and a printed circuit board 14. The connector 10 accommodates for varying the orientation of the optical subassembly 12 relative to the printed circuit board 14 in the x, y, and z directions. This allows alignment of the box optical subassembly 12 with the printed circuit board 14 and aids with placement within a housing of a transceiver module, such as transceiver module 60 (FIG. 4), as will be disclosed in more detail hereinafter.

As shown, optical subassembly pins 16 extend from a side of the box optical subassembly 12. The optical subassembly pins 16 can carry the low speed signals from the printed circuit board 14 that control the operation of the electrical components disposed in the box optical subassembly 12, such as, but not limited to, a laser driver, a thermal electric cooler 13, components associated with a laser diode, and other components disposed within the box optical subassembly 12. It will be understood that the printed circuit board 14 can optionally include controllers and other circuitry to control the components within the box optical subassembly 12, rather than such control circuitry being disposed within the box optical subassembly 12.

Figure 2:
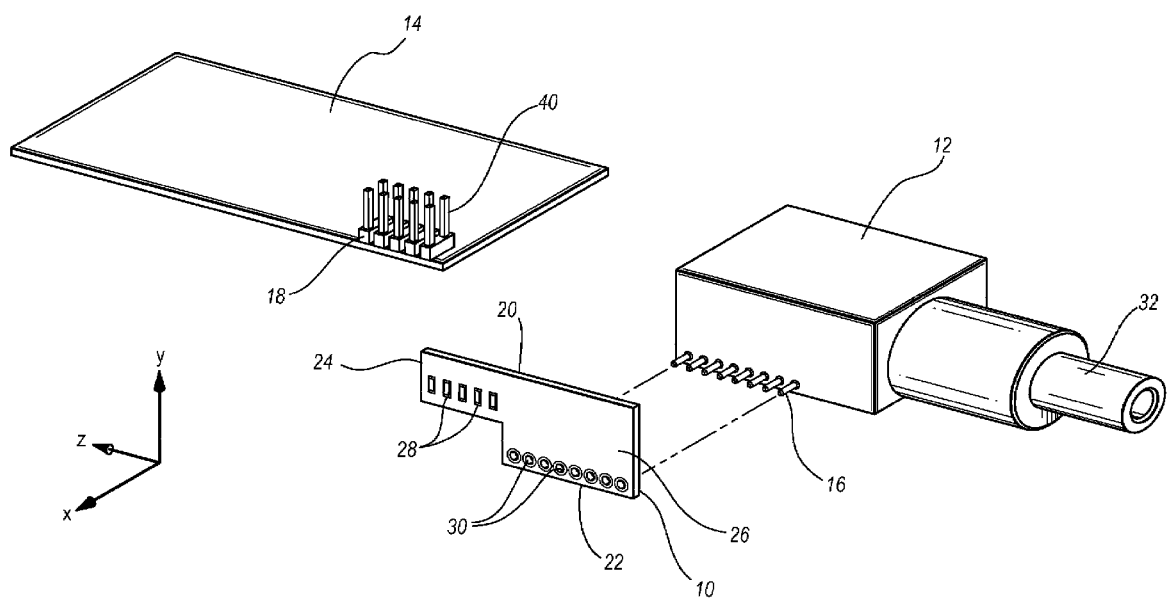
FIG. 2 illustrates an exploded perspective view of the connector of FIG. 1.

As illustrated in FIG. 2, the connector 10 can include a top surface 20 and a bottom surface 22. The bottom surface 22 has a generally stepped configuration creating a first portion 24 and a second portion 26. The first portion 24 has a smaller cross-sectional configuration than second portion 26, however, other configurations are possible so that cross-sectional dimensions can be substantially identical or the first portion 24 has a generally greater cross-sectional configuration to that of second portion 26.

Figure 3:
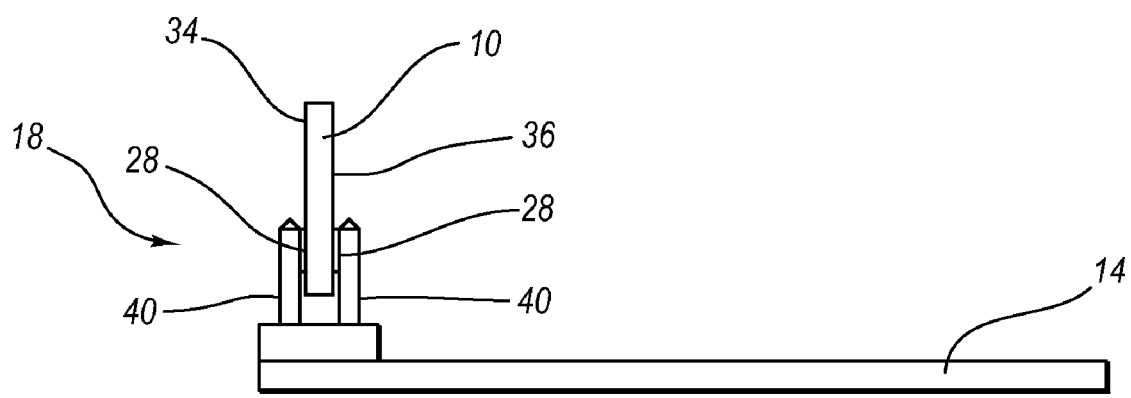
FIG. 3 illustrates a cross-sectional side view of the connector of FIG. 1 mounted to the printed circuit board.

The first portion 24 can include a plurality of electrical contact pads 28. These contact pads 28 can be located on a first surface 24 and/or a second surface 36, as shown in FIG. 3, are so configured to contact one or more of pins 40 on the printed circuit board 14 and accommodate variations in the relative orientation of the optical subassembly 12 relative to the printed circuit board 14. For instance, the pads 28 are configured such that any movement in the y direction of the printed circuit board relative to the optical subassembly 12, or vice versa, can be accommodated by the height of the pads 28. Similarly, any variation in the z direction of the printed circuit board 14 relative to the optical subassembly 12 can be accommodated by the width of the pads 28.

Figure 4:
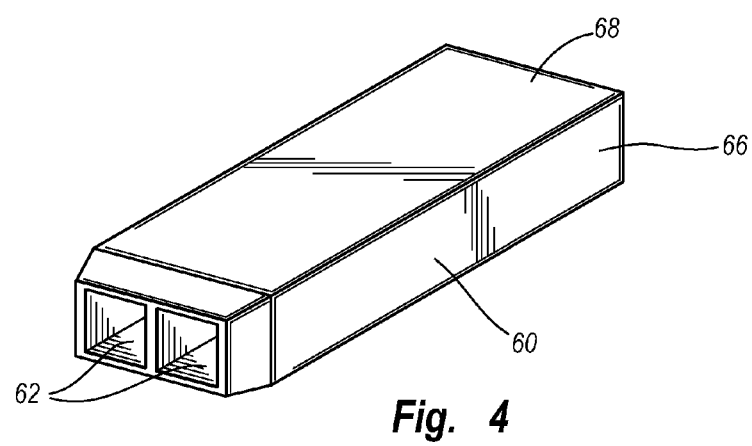
FIG. 4 illustrates a perspective view of a transceiver module that can receive the connector of FIG. 1.

Returning to FIG. 2, the second portion 26 can include through-hole contacts 30 that receive optical subassembly pins 16 and are electrically connected to the pads 28 via typical electrical traces (not shown). As with the pads 28, the through-hole contacts 30 also have sufficient diameters to accommodate movement of or positioning of the optical subassembly pins 16 in the x, y, and z directions. In this manner, the connector 10 can accommodate various positions of the optical subassembly 12 relative to the connector 10 and also various positions of the printed circuit board 14 relative to the connector 10. This aids with aligning the optical subassembly 12 both with a port 62 (FIG. 4) of the transceiver module 60 (FIG. 4) and also the printed circuit board 14. This limits the possibility of misalignment of the optical subassembly 12, including its nose 32, during manufacture of the transceiver module 60 (FIG. 4).

Turning to printed circuit board 14, and mentioned above, to aid with absorbing the variations in position of optical subassembly 12 relative to printed circuit board 14, the printed circuit board 14 includes a pin header 18 having two rows of connector pins 40. These pins 40 extend from the printed circuit board 14 and are spaced apart to receive a portion of the connector 10, as illustrated in FIG. 3. The spacing between the pins 40 and the configuration of the connector 10 is such that the variability in the x, y, and z position, of the optical subassembly 12 (FIG. 2) can be controlled. For instance, variability in the x direction can be controlled because the pin spacing of the header 18 is sufficiently wide to accommodate variations in the position of the connector 10. These pins 40 are also of sufficient length to accommodate variations in the y-direction of the connector 10 and the optical subassembly 12 (FIG. 2) and have sufficient width to accommodate variations in the z-direction of the connector 10 and the optical subassembly 12 (FIG. 2), by so doing, the pads 28 and pins 40 aid in aligning the optical subassembly 12 to the printed circuit board 14 in at least one of the x-directions, y-directions, and z-directions.

The configuration of the connector 10 and the pins 40 of the printed circuit board 14 are useful in aiding with alignment of the optical subassembly 12 and the printed circuit board 14. During the manufacture of the transceiver module 60 of FIGS. 4 and 5, each optical subassembly can be optically aligned with the port 62 of the transceiver module 60 that receives an optical connector (not shown). It is preferable that the nose 32 of the optical subassembly 12 be generally parallel and straight with the port 62 of the transceiver module 60 so that the optical connector can engage with the optical subassembly 12 and forces applied by the optical connector are not transferred to the other components of the transceiver module 60, i.e. the connector 10 and the printed circuit board 14. The use of the connector 10 decreases complexity of optically aligning the optical subassembly 12 by using the location of the optical subassembly 12 within the transceiver module 60 as a fixed position and varying the position of the printed circuit board 14 relative to the transceiver module 60 and the optical subassembly 12. More specifically, as part of the manufacturing process, the position of the connector 10 relative to the optical subassembly 12 can be normalized and then subsequently the position of the printed circuit board 14 relative to the combined connector 10 and optical subassembly 14 can be normalized. This aligns the optical subassembly 12, the connector 10, and the printed circuit board 14 easily and efficiently during manufacture.

One way to achieve the desired alignment is by using one or more jigs. Using one jig the optical subassembly 12 can receive the connector 10. Since the position of the optical subassembly pins 16 relative to the through-hole contacts 30 can vary, the through-hole contacts 30 in the connector 10 can be used to compensate for changes in the x, y, and z positions of the optical subassembly pins 16 and the connector 10. During the manufacturing process, the optical subassembly pins 16 can pass through through-hole contacts 30 and soldered to the through-hole contacts 30. The physical connection between the optical subassembly pins 16 and the through-hole contacts 30 can be made by hand soldering, by reflow of solder paste formed on the optical subassembly pins 16 and/or the through-hole contacts 30, by a hot bar process, or by any other suitable technique.

Mounting the optical subassembly pins 16 to through-hole contacts 30 can result in substantial self-alignment of the connector 10 with the optical subassembly 12. Once the soldering has been performed, the combined optical subassembly 12 and the connector 10 becomes a single component that can then be mounted to the printed circuit board 14.

Mounting the connector 10 to the printed circuit board 14 can be achieved using another jig or the same jig used to connect the connector 10 to the optical subassembly 12. In either case, and with reference to FIGS. 2 and 3, the connector 10 mounts to the printed circuit board 14 as the pads 28 are connected to the pins 40. The physical connection between the pins 40 and the pads 28 can be made by hand soldering, by reflow of solder paste formed on the pads 28 and/or pins 40, or by any other suitable technique. As mentioned before, the optical subassembly 12 will be orientated relative to the printed circuit board 14 to maintain the alignment within the port 62 (FIG. 4) of the transceiver module 60 (FIG. 4). As such, the position of the pads 28 relative to the pins 40 can be varied in each of the x, y, and z directions so that correct alignment is achieved. More generally, the arrangement of the pins 40 and of the pin leader 40, such as two rows of pins, accommodate receipt of the connector in such a way to accommodate variations in the alignment of the optical subassembly 12 with the printed circuit board 14.

With this configuration, the connector 10 occupies a very small space between the optical subassembly 12 and the printed circuit board 14. This enables a smaller transceiver module 60 (FIG. 4) to be used to contain the printed circuit board 14, the optical subassembly 12, and the connector 10. For instance, the connector 10 can be disposed between the optical subassembly 12 at a wall of the housing of the transceiver module. In addition, with the connector being rigid, i.e. having rigidity greater than the flex circuit, the variability associated with use of a flex circuit is eliminated, thereby decreasing manufacturing time and increasing repeatability of manufacturing steps.

Figure 5:
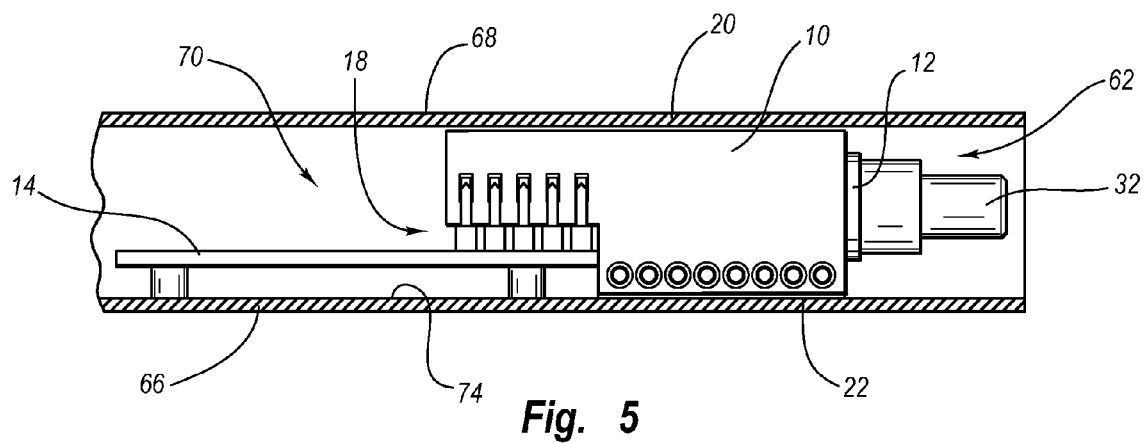
FIG. 5 illustrates a cross-sectional side view of the transceiver module of FIG. 4.

Following alignment of the optical subassembly 12, the connector 10, and the printed circuit board 14, the combined structure or assembly can be disposed within an interior of the transceiver module 60, as shown in FIGS. 4 and 5. As illustrated in FIG. 4, the transceiver module 60 includes a base portion 66 and a top portion 68. Disposed between the base portion 66 and the top portion 68 is a cavity 70, as illustrated in FIG. 5. This cavity 70 can be defined by the walls and the base 74 of the base portion 66. Disposed between the base portion 66 and the top portion 68 within the cavity 70 are the optical subassembly 12, the connector 10, and the printed circuit board 14.

Depending on the particular configuration of the connector 10, it can be possible to configure second portion 26 of connector 10 so that a top 20 of the connector 10 contacts the top portion 68 while a portion of the bottom 22 contacts the base portion 66. Stated another way, in contrast to other transceiver modules, the connector 10 can extend from the base portion 66 to the top portion 68 as the top 20 contacts the top portion 68 and the bottom 22 of the second portion 26 contacts the base portion 66. This configuration fixes the orientation of the optical subassembly 12 and the connector 10 and aids in preventing movement of the optical subassembly 12 from side loads, shock, and vibration. In addition, since a portion of the connector 10 extends the entire distance between the base portion 66 and the top portion 68, any forces exerted upon the top portion 68 during manufacture are transmitted to the base portion 66 and not the optical subassembly 12, as typically occurs during current manufacturing techniques. This limits the possibility of the optical subassembly 12 being moved out of alignment and so becoming damaged during insertion and removal of an optical connector (not shown) within the ports (not shown) of the transceiver module 60.

Although discussion is made of second portion 26 extending between the top portion 68 and the base portion 66 of the transceiver module 60, it can be appreciated that in other configurations the second portion 26 need not extend the full distance. While other techniques and/or structures may be used to limit side loads, shock, and vibrations.

The exemplary embodiments of the methods and devices of the present invention have many advantages over the prior systems. Since flex circuits typically require twisting, turning, or rotation of the flex circuit to fit within the transceiver module it is difficult and time consuming to assemble the transceiver module. In contrast, since the connector 10 is a rigid structure and has a defined configuration, manufacturing processes can be more simply automated to easily attach the optical subassembly to the connector 10 and subsequently connecting the connector 10 to the printed circuit board.

In addition, the inclusion of the connector 10 can aid in reducing the overall configuration and dimensions of the transceiver module. The connector can have a fixed small profile that can easily and repeatably fit within a transceiver module. This is in contrast to a flex circuit that changes profile and shape during manufacture, thereby causing difficulty in repeatably mounting the flex circuit to the pads and pins of the optical subassembly and the printed circuit board. The rigid configuration of the connector also enables the use of automated manufacturing processes.

In the configuration where a portion of the connector 10 extends from the top portion to the base portion of the transceiver module housing, the connector 10 aids in reducing the effects of load and side loads and forces that may be applied to the transceiver module. It also reduces the adverse effects that may occur upon an optical subassembly disposed within the transceiver module by directing forces from one portion of the transceiver module to another portion of the transceiver module without those forces also being applied to the optical subassembly. This again limits the potential for misalignment of the optical subassembly and so degradation of signal transmission through incorrect coupling of the nose of the optical subassembly with an optical connector that exits to the optical network.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A transceiver module comprising:
   a base portion;
   a top portion disposed over the base portion;
   an optical subassembly disposed between the base portion and the top portion, the optical subassembly comprising a laser diode, a laser driver, and at least one pin receiving a driver signal for said laser driver;
   a printed circuit board disposed between the base portion and the top portion, wherein said printed circuit board further comprises at least one pin header, said at least one pin header comprises a plurality of pins arranged in two rows; and
   a rigid connector having physical dimensions that extend at least from said at least one pin to said printed circuit board, the base portion, and the top portion, wherein said rigid connector comprises a plurality of a plurality of pad contacts, each of said plurality of pad contacts being selectively connectable with at least one pin of said plurality of pins.

2. A transceiver module as recited in claim 1, wherein said plurality of pins arranged in two rows selectively receive said rigid connector to accommodate variations in the alignment of the optical subassembly and the printed circuit board.

3. A transceiver module as recited in claim 1, wherein said rigid connector comprises a first surface and a second surface, each of said first surface and said second surface comprises at least one of said plurality of pad contacts.

4. A transceiver module as recited in claim 1, wherein said optical subassembly further comprises at least one thermal electric cooler.

5. A transceiver module as recited in claim 4, wherein said at least one pin receives at least one control signal for said at least one thermal electric cooler.

6. A transceiver module as recited in claim 1, wherein said rigid connector further comprises at least one through-hole contact, said at least one pin being selectively received by said at least one through-hole contact.

7. A transceiver module comprising:
   a top portion mountable to a base portion, said base portion comprising a cavity defined by at least one wall and a base;
   an optical subassembly mountable within said cavity, said optical subassembly comprising a laser diode, a laser driver, and a plurality of optical subassembly pins, at least one of said plurality of pins selectively receiving a driver signal for said laser driver;
   a printed circuit board mountable within said cavity, said printed circuit board comprising a plurality of pin header pins; and
   a connector extending from said plurality of optical subassembly pins to said printed circuit board, said connector mountable within said cavity between a portion of said optical subassembly and said at least one wall,
   wherein said connector comprises a plurality of pad contacts, said pad contacts being selectively connectable with said plurality of pin header pins.

8. A transceiver module as recited in claim 7, wherein said connector comprises a first portion and a second portion, said second portion extending from said base to said top portion.

9. A transceiver module as recited in claim 8, wherein said second portion comprises a plurality of through-hole contacts, said plurality of optical subassembly pins being selectively received within said plurality of through-hole contacts.

10. A transceiver module as recited in claim 7, wherein said plurality of pin header pins are arranged in two rows.

11. A transceiver module as recited in claim 10, wherein said two rows of pin header pins are spaced apart to receive at least a portion of the connector.

12. A transceiver module as recited in claim 7, wherein each pad contact of said plurality of pad contacts engages with a pin of said plurality of pin header pins, a position of each engaged pad contact relative to its corresponding pin header pin being based upon a position of said optical subassembly relative to said printed circuit board.

13. A transceiver module as recited in claim 7, wherein said plurality of pad contacts selectively mount to said plurality of pin header pins and said plurality of through-hole contacts selectively receive said plurality of optical subassembly pins to align said optical subassembly to said printed circuit board in at least one of an x-direction, a y-direction and a z-direction.

* * * * *